(12) United States Patent
Tamura et al.

(10) Patent No.: US 7,613,218 B2
(45) Date of Patent: Nov. 3, 2009

(54) SELF-PULSATION NITRIDE SEMICONDUCTOR LASER DEVICE AND METHOD FOR FABRICATING THE SAME

(75) Inventors: Satoshi Tamura, Osaka (JP); Norio Ikedo, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/637,739

(22) Filed: Dec. 13, 2006

(65) Prior Publication Data

US 2007/0274358 A1 Nov. 29, 2007

(30) Foreign Application Priority Data

Feb. 28, 2006 (JP) .............................. 2006-053479

(51) Int. Cl.
*H01S 5/00* (2006.01)

(52) U.S. Cl. ................................ 372/46.01; 372/45.01

(58) Field of Classification Search .............. 372/45.01, 372/46.01, 46.015
See application file for complete search history.

(56) References Cited

U.S. PATENT DOCUMENTS 6,522,676 B1 * 2/2003 Goto et al. ............... 372/43.01

2003/0201441 A1 * 10/2003 Nakamura et al. ............ 257/64

FOREIGN PATENT DOCUMENTS

| JP | 10-93199 | 4/1998 |
|---|---|---|
| JP | 2003-078215 | 3/2003 |

* cited by examiner

*Primary Examiner*—Minsun Harvey
*Assistant Examiner*—Patrick Stafford
(74) *Attorney, Agent, or Firm*—McDermott Will & Emery LLP

(57) ABSTRACT

In a buried type structure including an active layer sandwiched between an n-type cladding layer and a p-type cladding layer and a current blocking layer having an opening for confining a current flowing to the active layer, a regrown layer made of a nitride semiconductor doped with a p-type impurity is formed on the current blocking layer so as to cover the opening of the current blocking layer, and a portion of the regrown layer buried in the opening disposed to be adjacent to a side face of the opening and having a given width W is changed to have the n-type conductivity. Accordingly, the opening of the current blocking layer is effectively narrowed, so as to realize a self-pulsation nitride semiconductor laser device.

7 Claims, 7 Drawing Sheets

US 7,613,218 B2

SELF-PULSATION NITRIDE SEMICONDUCTOR LASER DEVICE AND METHOD FOR FABRICATING THE SAME

CROSS-REFERENCE TO RELATED APPLICATIONS

This application claims priority under 35 U.S.C. §119 on Patent Application No. 2006-053479 filed in Japan on Feb. 28, 2006, the entire contents of which are hereby incorporated by reference.

BACKGROUND OF THE INVENTION

The present invention relates to a nitride semiconductor laser device and a method for fabricating the same, and more particularly, it relates to a self-pulsation nitride semiconductor laser device having a buried type current blocking structure and a method for fabricating the same.

Currently, a group III-V nitride-based compound semiconductor including group III elements of aluminum (Al), gallium (Ga) and indium (In) and a group V element of nitrogen (N), typified by gallium nitride (GaN) and represented by a general formula, $In_XGa_YAl_{1-X-Y}N$ (wherein $0 \leq X \leq 1$, $0 \leq Y \leq 1$ and $X+Y \leq 1$), i.e., what is called a nitride semiconductor (hereinafter referred to as a GaN-based semiconductor), is regarded remarkable. With respect to, for example, an optical device, a light emitting diode (LED) using a nitride semiconductor is used in a large display device, a traffic light and the like. Also, a white LED obtained by combining an LED using a nitride semiconductor and a fluorescent material is partially commercialized and is expected to be substituted for currently used lighting equipment when the luminous efficiency is improved in the future.

Furthermore, a violet semiconductor laser device using a nitride semiconductor is now being earnestly studied and developed. As compared with a conventional semiconductor laser device emitting red or infrared light used for an optical disk such as a CD or a DVD, a spot diameter obtained on the optical disk can be reduced in using the violet laser device, and hence, the recording density of the optical disk can be improved.

A violet semiconductor laser device currently practically used employs a ridge structure as shown in FIG. 9. In this structure, a ridge 101 is formed by dry etching, and the lateral mode is controlled by adjusting the width and the depth of the ridge.

In this ridge structure, however, since an electrode 102 should be formed on the ridge 101, the area range of the electrode is restricted. Also, since the ridge 101 is formed by the dry etching, the depth of the ridge is varied, resulting in varying the lateral mode characteristic. Due to such problems in the structure and the fabrication, a violet semiconductor laser device with sufficient performance and reliability has not been realized in a good yield.

On the other hand, a buried type laser device as shown in FIG. 10 is employed for a GaAs-based semiconductor laser device but not yet employed for a GaN-based semiconductor laser device. This is because it is difficult to stably etch a GaN-based semiconductor with small damage. A general method for processing a GaN-based material is dry etching, and when an opening 104 is formed in a current blocking layer 103, if the dry etching is employed, a damage is caused in the vicinity, which degrades the device characteristics. Alternatively, wet etching is generally employed for etching with small damage, but wet etching technique for a GaN-based material with high reproducibility has not been established yet. In addition to such processing technique for a GaN-based semiconductor, crystal of a GaN-based semiconductor is difficult to grow, and it is difficult to regrow a cladding layer 106 with high crystallinity after forming the opening 104 in the current blocking layer 103. This is probably another reason why the buried type structure is not employed.

However, in employing the buried type structure, a distance from an InGaN active layer to the current blocking layer 103 affecting the lateral mode characteristic can be accurately controlled, and serial resistance can be reduced because a contact electrode can be formed in a large area. Thus, the buried type structure is variously advantageous to the ridge structure in the performance and the reliability.

Therefore, some techniques for overcoming the aforementioned problems of the buried type structure peculiar to a GaN-based semiconductor have been proposed.

Japanese Laid-Open Patent Publication No. 2003-78215 discloses a technique to improve the reproducibility of etching for an opening of a current blocking layer by increasing etch selectivity of a GaN-based semiconductor. Specifically, after forming an amorphous current blocking layer on a crystalline cladding layer, the current blocking layer is partly etched by wet etching using a phosphoric acid-containing solution, and thereafter, annealing is performed at a high temperature, so as to crystallize the amorphous current blocking layer.

According to this technique, in etching the amorphous current blocking layer, since an etching ratio between an amorphous layer and a crystalline layer is large, the underlying crystalline cladding layer can be used as an etching stopper, and hence, the etching of the current blocking layer can be well controlled.

However, although the amorphous layer is crystallized through the annealing at a high temperature after forming the opening in the amorphous current blocking layer, crystal of a GaN-based semiconductor is difficult to grow as described above, and a re-crystallized layer obtained through the high temperature annealing does not always have high quality. Furthermore, even when a regrown layer is formed on the current blocking layer with such low crystallinity, the regrown layer is difficult to attain high crystallinity.

Japanese Laid-Open Patent Publication No. 10-93199 discloses a technique to form an opening in a current blocking layer without etching an underlying cladding layer by forming a re-evaporation layer working as an etching stopper between the cladding layer and the current blocking layer. In this case, the re-evaporation layer exposed in the opening of the current blocking layer is made of a material that can be selectively removed through evaporation by annealing after forming the opening in the current blocking layer. This procedure for evaporating the re-evaporation layer can be performed in a MOCVD system, and hence, without exposing the exposed underlying cladding layer to the air but while keeping its surface clean, the formation of a regrown layer can be performed subsequently to the evaporation procedure. Thus, the regrown layer can be formed with high crystallinity.

SUMMARY OF THE INVENTION

Although the processability of a current blocking layer and the crystallinity of a regrown layer can be improved by employing the technique described in Japanese Laid-Open Patent Publication No. 10-93199, a GaN-based semiconductor layer with high performance and high reliability has not been realized yet, and a GaN-based semiconductor laser device with the buried type structure has not been put to practical use.

The present inventors considered the essential advantageous performance of the buried type structure and made examination on a method for controllably forming an opening in a current blocking layer. As a result, the inventors found a method described below and filed a patent application for the method (Japanese Patent Application No. 2005-253824).

In this method, after forming an active layer sandwiched between cladding layers on a GaN substrate, in forming a current blocking layer on the cladding layer and forming an opening in the current blocking layer, the top face (i.e., a group III face of the current blocking layer is wet etched by a method designated as photoelectrochemical (PEC) etching with the reverse face (i.e., a group V face) of the GaN substrate protected from an etching solution.

The PEC etching is performed with a GaN substrate dipped in an electrolytic solution while externally irradiating an etching target (a current blocking layer in the present case) with UV, and the etching is proceeded through dissolution of the current blocking layer caused by holes generated on the surface of the current blocking layer through the UV irradiation.

The present inventors found that a hole generated through the UV irradiation has a property to move to the face of the group V element of a GaN-based semiconductor and hence the etching is not proceeded on the face of the group III element. The inventors thought that etching of the current blocking layer (the face thereof of the group III element) cannot be stably performed because of this phenomenon. When the current blocking layer was etched with the reverse face (the face of the group V element) of the GaN substrate protected from the etching solution, the etching could be performed stably.

Through application of this etching method, a GaN-based semiconductor laser device with a buried type structure could be stably obtained, and as a result, the characteristics of the semiconductor laser device could be evaluated with high reproducibility.

While evaluating the characteristics of GaN-based semiconductor laser devices with the buried type structure under the circumstances, it was found that some samples had threshold currents of laser oscillation largely different from a design value although they had the same structure as others.

In general, a cross-section of a sample is observed with an electron microscope for confirming the resultant structure of the sample. FIG. 1A shows an electron micrograph of a cross-section of a sample having a threshold current largely different from a design value and FIG. 1B is a schematic diagram thereof.

As shown in FIG. 1B, an n-type AlGaN current blocking layer 2 having an opening 4 is formed on a p-type GaN guiding layer 1, and a p-type GaN guiding layer 3 is formed thereon. (Note: This sample has a structure in which a guiding layer is provided between a cladding layer and an active layer.)

In order to observe such a cross-sectional structure with an electron microscope, reflected electrons are detected so as to obtain contrast derived from a difference in the composition of the crystal, and a difference in the conductivity among respective layers can be obtained as contrast by detecting secondary electrons.

When the present inventors detected secondary electrons in the same region as that shown in FIG. 1A, a secondary electron image as shown in FIG. 1C was obtained. FIG. 1D is a schematic diagram thereof.

When FIGS. 1A and 1B are compared with FIGS. 1C and 1D, it is found that a boundary formed by the difference in the composition (shown with an arrow A) is shifted from a boundary formed by the difference in the conductivity (shown with an arrow B). This means that a portion with a given width of the current blocking layer 2 in contact with the side face of the opening 4 is changed to have the n-type conductivity or into a highly resistant layer in the GaN guiding layer 3 that should have the p-type conductivity.

The cause of such a change to the n-type conductivity is not obvious, but the following seems to be one factor: When the p-type GaN guiding layer 3 is regrown, a portion thereof regrown from the side face of the opening 4 easily incorporates an n-type impurity or a defect functioning as a donor is easily caused.

For further examination, samples in which the portions changed to have the n-type conductivity (hereinafter referred to as n-type conductivity changed portions) have different widths are obtained with the growth temperature for the p-type GaN guiding layer 3 changed, and laser oscillation threshold currents of these samples are measured, resulting in obtaining a graph of FIG. 2. The abscissa indicates the growth temperature of the p-type GaN guiding layer 3 and the ordinate indicates the laser oscillation threshold current. As is understood from FIG. 2, the threshold current starts to increase when the growth temperature exceeds 1100° C.

In the samples obtained by employing the various growth temperatures, reflection electron images and secondary electron images are observed with an electron microscope so as to measure the widths of the n-type conductivity changed portions, and the results are plotted on the (upper) abscissa of FIG. 2. Thus, it is found that the increase of the threshold current is concerned with the width of the n-type conductivity changed portion. Specifically, when the width of the n-type conductivity changed portion exceeds 0.15 μm, the threshold current obviously increases.

This phenomenon can be understood as follows: As shown in FIG. 3, a current from a p-type AlGaN cladding layer 5 is confined in the p-type GaN guiding layer 3 where the conductivity is not changed to the n-type and flows to an active layer (not shown) disposed below the guiding layer. As a result, light is emitted from the active layer and a large gain is obtained. On the other hand, the current minimally flows to a portion of the active layer disposed below the n-type AlGaN current blocking layer 2 through an n-type conductivity changed portion 6, and hence, this portion of the active layer works as an absorbing layer. Light confinement in the lateral direction is performed by using a difference in the refractive index between the n-type AlGaN current blocking layer 2 and the p-type GaN guiding layer 3, and hence, light is distributed in a high ratio in a portion where the absorption is caused. This seems to cause the increase of the laser oscillation threshold current.

When the width the n-type conductivity changed portion is increased and a substantial width of the guiding layer is reduced, a resistance component is increased in this portion, which can degrade the electric characteristics.

Such an unexpected change to the n-type conductivity seems to be caused through various factors. Therefore, if the structure or the process for a semiconductor laser device is designed without paying attention to this phenomenon, unexpected variation of the electric characteristics such as a current threshold value may be caused.

On the other hand, from another point of view, if the width of an n-type conductivity changed portion can be controlled with high reproducibility by sufficiently examining this phenomenon of the change to the n-type conductivity, a novel devise structure can be expected to realize by positively utilizing an n-type conductivity changed portion to the contrary.

The present invention was devised on the basis of the aforementioned findings, and an object of the invention is providing a self-pulsation nitride semiconductor laser device with a buried type structure having stable characteristics and a method for fabricating the same by positively utilizing the phenomenon of the change to the n-type conductivity.

The self-pulsation nitride semiconductor laser device of this invention includes an active layer sandwiched between cladding layers; and a current blocking layer having an opening for confining a current flowing to the active layer, and a regrown layer made of a nitride semiconductor doped with a p-type impurity is formed on the current blocking layer for covering the opening of the current blocking layer, and a portion of the regrown layer buried in the opening of the current blocking layer disposed to be adjacent to a side face of the opening and having a given width is changed to have an n-type conductivity.

In this self-pulsation nitride semiconductor laser device, a current guiding width of the regrown layer buried in the opening can be reduced by changing the portion of the p-type regrown layer adjacent to the side face of the opening and having the given width into an n-type conductivity changed portion. This leads to an effect equivalent to that attained by effectively reducing the width of the opening of the current blocking layer. Therefore, when the opening is formed with a large width and the regrown layer is formed so as to cover the opening, the crystallinity of the regrown layer can be kept as well as the n-type conductivity changed portion is formed in a self-alignment manner to be adjacent to the side face of the opening, so that a current blocking structure in which the width of the opening is effectively reduced can be obtained. In other words, when the width of the n-type conductivity changed portion is controlled so that the effective current guiding width cannot exceed a width necessary for the self oscillation, a self-pulsation nitride semiconductor laser device having stable characteristics can be realized.

In this case, the given width of the portion of the regrown layer changed to have the n-type conductivity is preferably 0.25 μm or more. Thus, the current blocking effect of the n-type conductivity changed portion can be sufficiently exhibited.

Furthermore, the current blocking layer is preferably made of a nitride semiconductor layer doped with an n-type impurity, and the current blocking layer preferably has a smaller refractive index than the regrown layer. Moreover, the regrown layer may correspond to a part of the cladding layers.

The method of this invention for fabricating a self-pulsation nitride semiconductor laser device including an active layer sandwiched between cladding layers; and a current blocking layer having an opening for confining a current flowing to the active layer, includes the steps of forming the active layer sandwiched between the cladding layers on a substrate; forming the current blocking layer on one of the cladding layers; forming the opening for confining the current flowing to the active layer by etching a part of the current blocking layer; and forming a regrown layer made of a nitride semiconductor doped with a p-type impurity on the current blocking layer for covering the opening of the current blocking layer, and a portion of the regrown layer buried in the opening of the current blocking layer disposed to be adjacent to a side face of the opening and having a given width is changed to have an n-type conductivity.

In this case, the given width of the portion of the regrown layer changed to have the n-type conductivity is preferably 0.25 μm or more.

In the self-pulsation nitride semiconductor laser device and the method for fabricating the same according to the present invention, a portion of a p-type regrown layer adjacent to the side face of an opening of a current blocking layer is changed into an n-type conductivity changed portion having a given width. Therefore, a current guiding width of the regrown layer buried in the opening can be effectively reduced, so as to realize a self-pulsation nitride semiconductor laser device having stable characteristics.

DETAILED DESCRIPTION OF THE INVENTION

Figure 1B:
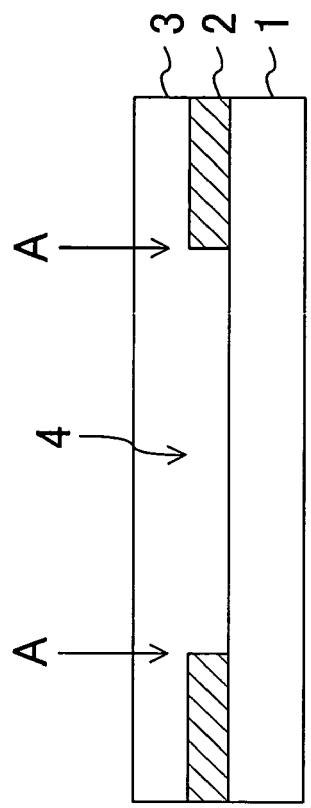
FIGS. 1A, 1B, 1C and 1D are electron micrographs and schematic diagrams thereof for explaining a phenomenon of change to the n-type conductivity concerned with the present invention.
Figure 1D:
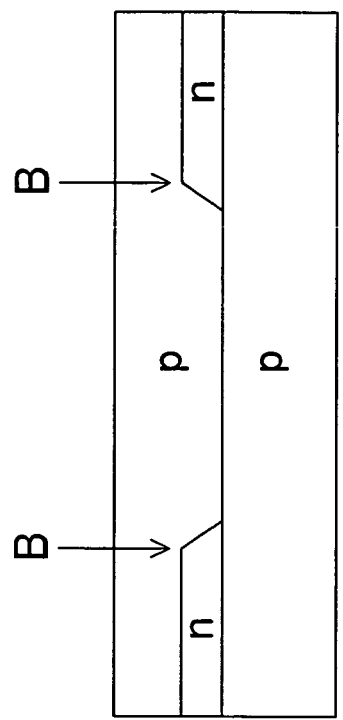
Figure 1A:
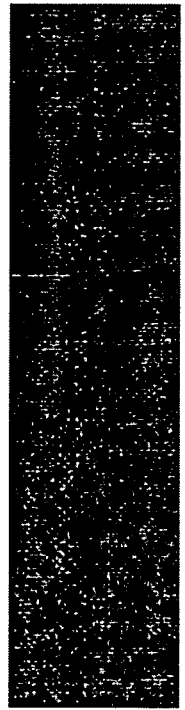
Figure 1C:
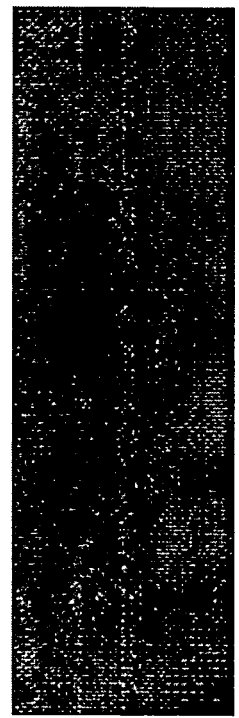
Figure 2:
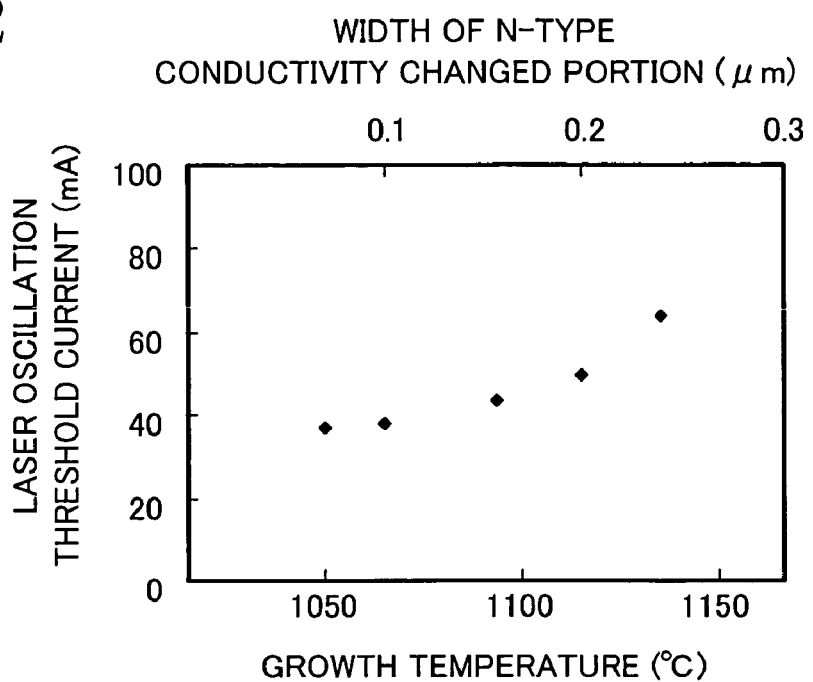
FIG. 2 is a graph of a laser oscillation threshold current for explaining the phenomenon of the change to the n-type conductivity concerned with the invention.

Now, preferred embodiments of the invention will be described with reference to the accompanying drawings. In the drawings referred to below, like reference numerals are used to refer to like elements for simplifying the description. It is noted that the present invention is not limited to the embodiments described below.

EMBODIMENT 1

The present inventors have regarded a self-pulsation nitride semiconductor laser device as a device for positively utilizing an n-type conductivity changed portion formed in employing a buried type current blocking structure.

Although a violet semiconductor laser is suitable as a light source for optical disks such as next generation DVDs, external feedback noise occurring in a reproducing operation is a problem, and in one of known methods for overcoming the problem, a self oscillation phenomenon of a semiconductor laser is used.

Figure 3:
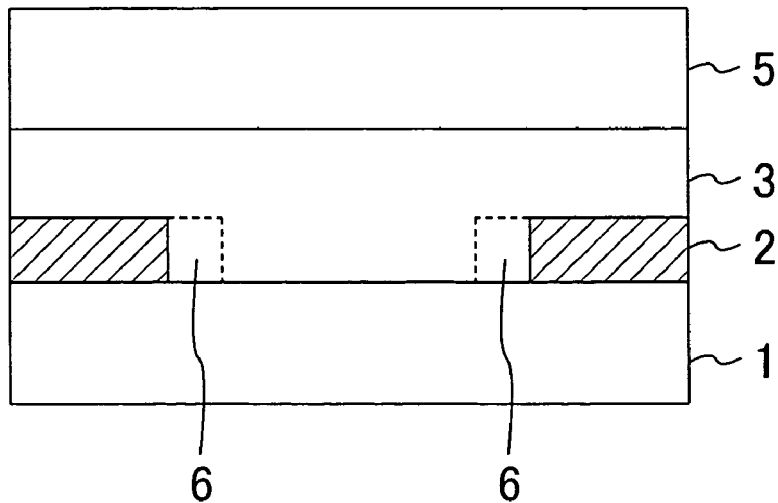
FIG. 3 is a schematic diagram for explaining the phenomenon of the change to the n-type conductivity concerned with the invention.

There are various conditions for causing the self oscillation of a semiconductor laser, and in a nitride semiconductor laser device having a buried type current blocking structure as shown in FIG. 3, it is necessary to set the width of the opening of the current blocking layer 2 to, for example, 1 μm or less.

When the opening is formed in the current blocking layer 2, the regrown layer 3 is formed so as to cover the opening. When the width of the opening is small, however, the aspect ratio of the opening is so large that the regrown layer to be buried therein is difficult to form with high crystallinity.

Therefore, the present inventors have examined a method for realizing a self-pulsation nitride semiconductor laser device without spoiling the crystallinity of a regrown layer, resulting in finding that such a method can be attained by controlling the formation of an n-type conductivity changed portion in the buried type current blocking structure.

Specifically, an opening of a current blocking layer is previously formed with a sufficiently large width, and a p-type regrown layer is formed so as to cover the opening. Thus, while keeping the crystallinity of the regrown layer, a part of the regrown layer adjacent to the side face of the opening is changed into an n-type conductivity changed portion with a given width, so that the effective width of the opening can be smaller than a width necessary for the self oscillation. In this manner, a self-pulsation nitride semiconductor laser device having stable characteristics can be realized.

Figure 4:
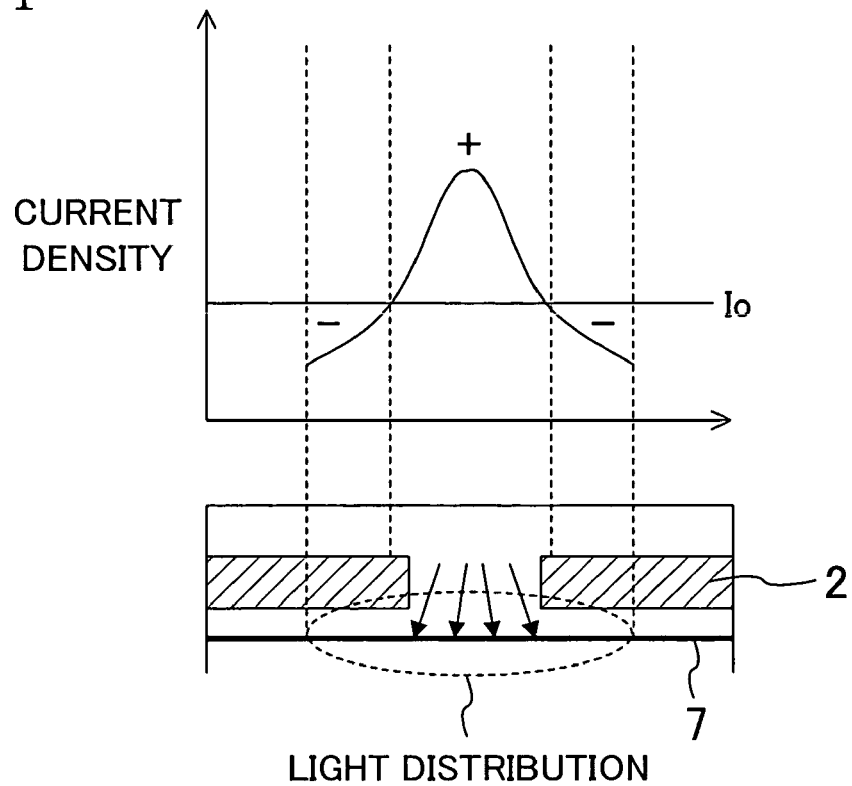
FIG. 4 is a diagram for explaining the mechanism of self oscillation concerned with the invention.

At this point, the mechanism of the self oscillation will be described with reference to FIG. 4. In general, when a current $I_0$ (carriers) exceeding a given quantity is injected into an active layer 7, the active layer 7 works for gain against a laser beam (as shown as a region marked with + in the drawing). However, when the current is smaller, the active layer 7 works for absorption (as shown as a region marked with − in the drawing). When the gain is larger than the absorption, laser oscillation is caused. The self oscillation is a series of periodical phenomenon as follows: i) The laser oscillation is caused; ii) carriers are consumed in the laser oscillation and the absorption becomes larger than the gain, so as to stop the laser oscillation; and iii) the reduced amount of carriers is compensated by current injection and the gain becomes larger than the absorption again, so as to cause the laser oscillation. In order to cause the self oscillation, it is necessary to reduce the gain obtained from the active layer 6 as compared with that obtained in a laser device not of the self-pulsation, and for this purpose, it is necessary to reduce the width of the opening (stripe) of the current blocking layer 2.

Figure 5:
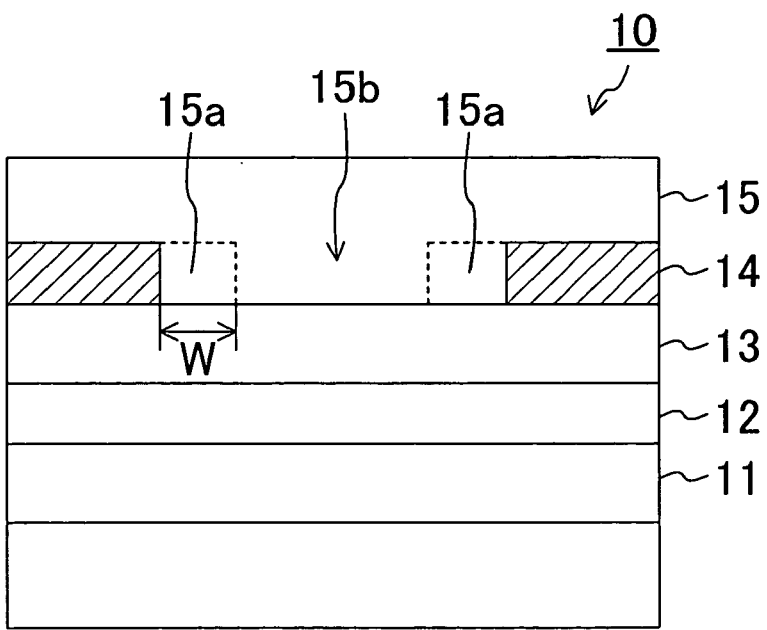
FIG. 5 is a cross-sectional view for schematically showing the architecture of a self-pulsation nitride semiconductor laser device according to Embodiment 1 of the invention.

Now, the basic architecture of a self-pulsation nitride semiconductor laser device according to Embodiment 1 of the invention will be described with reference to FIG. 5.

The self-pulsation nitride semiconductor laser device 10 has a buried type structure including an active layer 12 sandwiched between an n-type cladding layer 11 and a p-type cladding layer 13, and a current blocking layer 14 having an opening for confining a current flowing to the active layer 12. In this buried type structure, a regrown layer 15 made of a nitride semiconductor doped with a p-type impurity is formed on the current blocking layer 14 so as to cover the opening of the current blocking layer 14.

At this point, in the regrown layer 15 buried in the opening of the current blocking layer 14, a portion adjacent to the side face of the opening and having a given width W is a portion having the n-type conductivity, namely, an n-type conductivity changed portion 15a. The opening of the current blocking layer 14 is reduced effectively by the width of the n-type conductivity changed portion 15a (on one side), and in other words, a current guiding width 15b of the regrown layer 15 is effectively reduced. When the width of the n-type conductivity changed portion 15a is controlled so as to make the current guiding width 15b be a width necessary for the self oscillation, that is, a width of, for example, 1 μm or less, the self-pulsation nitride semiconductor laser device 10 can be obtained.

It is noted that the n-type conductivity changed portion 15a with the given width can be formed with high reproducibility by controlling the growth conditions for the regrown layer 15 such as the growth temperature, the growth rate and the V/III ratio.

However, when the width W of the n-type conductivity changed portion 15a (on one side) is less than 0.25 μm, the gain obtained from the active layer is always larger than the absorption, and hence, the self oscillation is minimally caused. Therefore, the width W of the n-type conductivity changed portion 15a is preferably 0.25 μm or more.

Although the regrown layer 15 generally corresponds to a part of the p-type cladding layer, its function is not herein limited to this but various other functions (such as the function as a guiding layer) may be provided in accordance with the characteristics of the semiconductor laser device 10.

The material for the regrown layer 15 is not particularly specified, and when a nitride semiconductor having a large growth rate in the lateral direction (such as GaN) is used, the n-type conductivity changed portion 15a can be easily formed with a large width W.

In this invention, the material for the current blocking layer 14 is not particularly specified, and for exhibiting the current blocking effect, the current blocking layer 14 is preferably made of a nitride semiconductor layer doped with an n-type impurity. This is because the current blocking effect can be improved by forming a PN junction between an n-type current blocking layer and a p-type regrown layer.

Moreover, for improving the light confining effect, the refractive index of the current blocking layer 14 is preferably lower than that of the regrown layer 15.

Figure 6A:
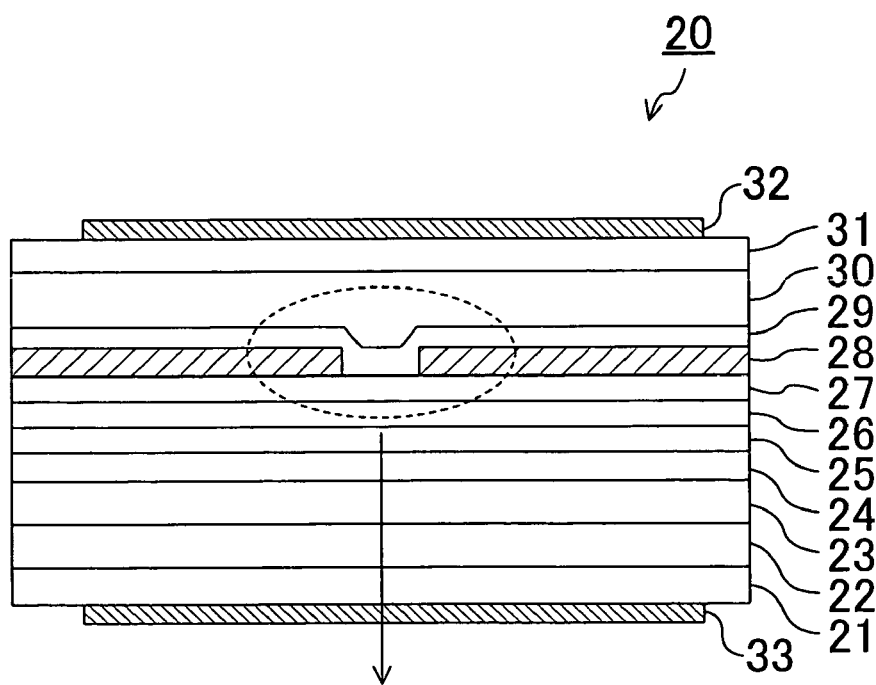
FIGS. 6A and 6B are cross-sectional views for showing a specific architecture of the self-pulsation nitride semiconductor laser device of Embodiment 1.

Next, an example of the specific architecture of a self-pulsation nitride semiconductor laser device 20 according to the invention will be described with reference to FIGS. 6A and 6B. FIG. 6A is a cross-sectional view of the self-pulsation nitride semiconductor laser device 20 and FIG. 6B is an enlarged cross-sectional view of a current blocking structure of FIG. 6A.

An n-GaN layer 22, an n-$Al_{0.06}Ga_{0.94}N$ cladding layer 23, an n-GaN guiding layer 24, an InGaN MQW active layer 25, a p-$Al_{0.15}Ga_{0.85}N$ overflow suppressing layer 26, a p-GaN guiding layer 27 and an n-$Al_{0.15}Ga_{0.85}N$ current blocking layer 28 are successively formed on a 2-inch GaN substrate 21.

An opening is formed in the n-$Al_{0.15}Ga_{0.85}N$ current blocking layer 28, and a p-GaN guiding layer 29 (including Mg), a p-AlGaN cladding layer 30 and a p-GaN contact layer 31 are regrown on an exposed portion of the p-GaN guiding layer 27 exposed in the opening and on the n-$Al_{0.15}Ga_{0.85}N$ current blocking layer 28. A p-type electrode 32 is formed on the p-GaN contact layer 31, and an n-type electrode 33 is formed on a face of the GaN substrate 21 where the grown layers are not formed.

Figure 6B:
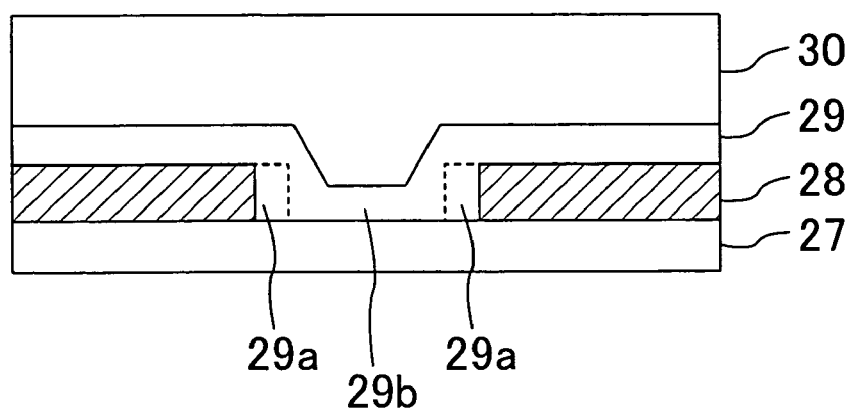

Herein, as shown in FIG. 6B, in the regrown layer (the p-GaN guiding layer) 29 buried in the opening of the current blocking layer 28, a portion adjacent to the side face of the opening and having a given width is an n-type conductivity changed portion 29a. A current is confined in a current guiding width 29b of the p-GaN guiding layer 29 and flows into the MQW active layer 29, and light of a wavelength of 405 nm is emitted. At this point, when the n-type conductivity changed portion 29a is formed so as to make the current guiding width 29b be a width necessary for the self oscillation, and for example, a width of 1 μm or less, the nitride semiconductor laser device 20 can be made to self oscillate. For example, when the width of the opening is 1.5 μm, the regrown layer (the p-GaN guiding layer) 29 is formed under growth conditions for allowing the n-type conductivity changed portion 29a (on one side) to have a width of 0.25 μm or more. In this case, since the opening is formed to have a comparatively large width of 1.5 μm, the regrown layer (the p-GaN guiding layer) 29 can be formed with high crystallinity.

Now, a method for fabricating a self-pulsation nitride semiconductor laser device of this invention will be described with reference to cross-sectional views of FIGS. 7A through 7D.

Figure 7A:
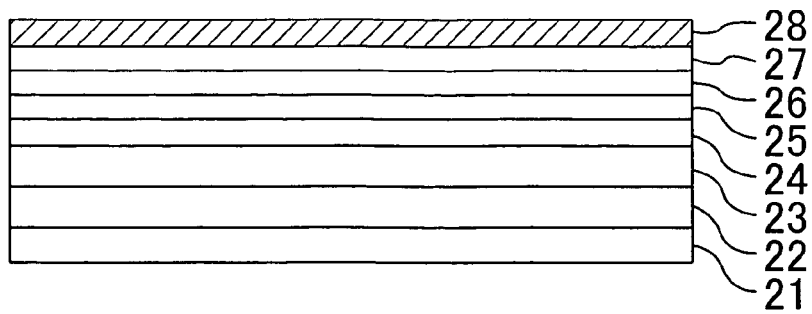
FIGS. 7A, 7B, 7C and 7D are cross-sectional views for schematically showing procedures in a method for fabricating the self-pulsation nitride semiconductor laser device of Embodiment 1 of the invention.

First, as shown in FIG. 7A, an n-GaN layer 22, an n-$Al_{0.06}Ga_{0.94}N$ cladding layer 23, an n-GaN guiding layer 24, an InGaN MQW active layer 25, a p-$Al_{0.15}Ga_{0.85}N$ overflow suppressing layer 26, a p-GaN guiding layer 27 and an n-$Al_{0.15}Ga_{0.85}N$ current blocking layer 28 are successively formed on a 2-inch GaN substrate 21.

Figure 7B:
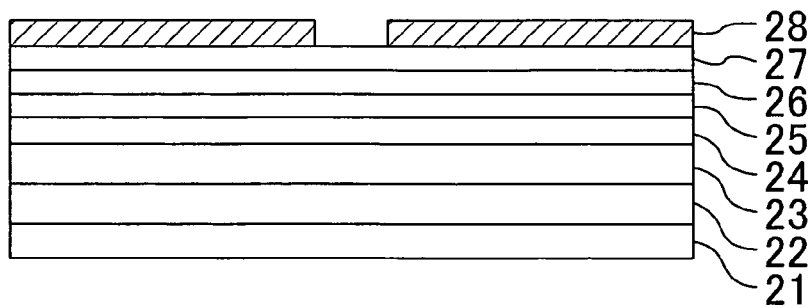

Next, as shown in FIG. 7B, a part of the n-$Al_{0.15}Ga_{0.85}N$ current blocking layer 28 is removed through etching. At this point, when the aforementioned PEC etching is employed, the etching can be stably performed without removing the underlying p-GaN guiding layer 27. It is noted that a protection film (not shown) of an oxide film or the like is formed on the rear face of the GaN substrate 21 at this point.

Figure 7C:
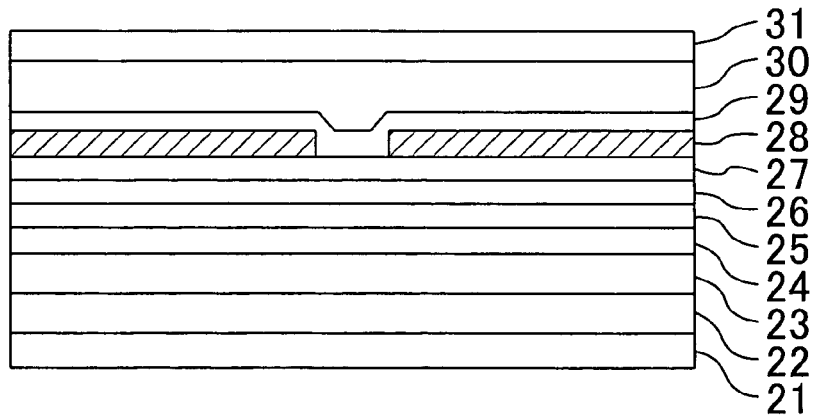

Then, as shown in FIG. 7C, a p-InGaN guiding layer 29, a p-AlGaN cladding layer 30 and a p-GaN contact layer 31 are regrown on the n-$Al_{0.15}Ga_{0.85}N$ current blocking layer 28. At this point, the p-GaN guiding layer 29 is regrown while doping with a p-type impurity (such as Mg).

Figure 7D:
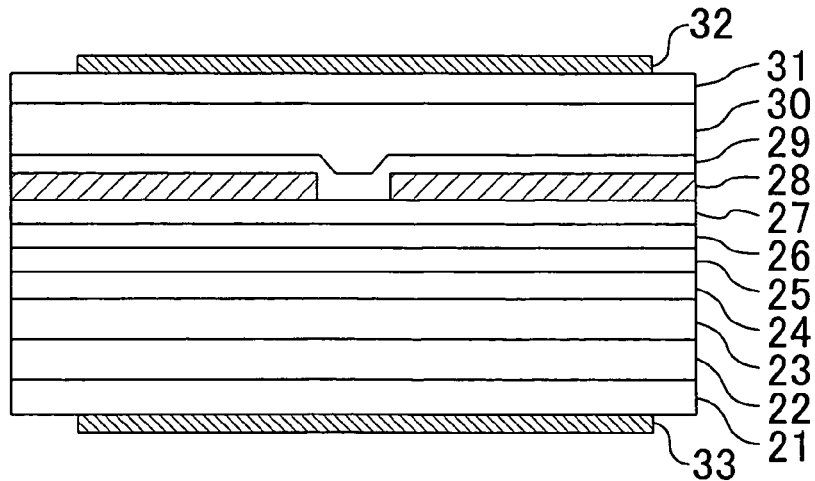

Ultimately, as shown in FIG. 7D, the resistance of the p-type layers is lowered by performing activation annealing in a nitrogen atmosphere at 780° C. for 20 minutes. Thereafter, a p-type electrode 32 is formed on the p-type contact layer 31. The p-type electrode 32 is preferably made of a multilayered film including Ni or Pd. Subsequently, the thickness of the GaN substrate 21 is reduced by polishing a group V face of the GaN substrate 21, and an n-type electrode 33 is formed on the polished face. The n-type electrode 33 is preferably made of a multilayered film including Ti or V.

EMBODIMENT 2

In Embodiment 1, the self-pulsation nitride semiconductor laser device is described as the device for positively utilizing an n-type conductivity changed portion. In this embodiment, application to another device will be described.

FIG. 8A through 8D are cross-sectional views for showing procedures in a method for fabricating a nitride semiconductor laser device according to Embodiment 2 of the invention.

Figure 8A:
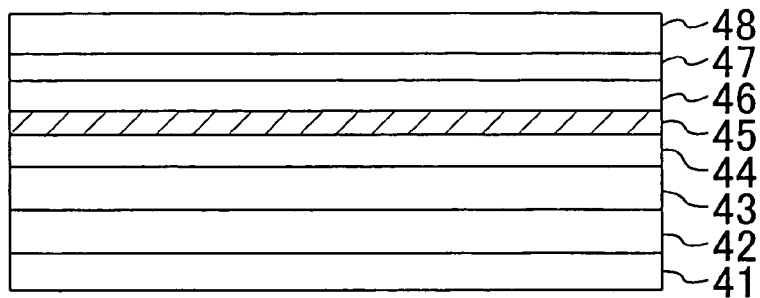
FIGS. 8A, 8B, 8C and 8D are cross-sectional views for schematically showing procedures in a method for fabricating a nitride semiconductor laser device according to Embodiment 2 of the invention.

First, as shown in FIG. 8A, an n-GaN layer 42, an n-$Al_{0.06}Ga_{0.94}N$ cladding layer 43, an n-GaN guiding layer 44, an InGaN MQW active layer 45, a p-$Al_{0.15}Ga_{0.85}N$ overflow suppressing layer 46, a p-GaN guiding layer 47 and a p-AlGaN cladding layer 48 are formed on a 2-inch GaN substrate 41 at a first stage of growth.

Figure 8B:
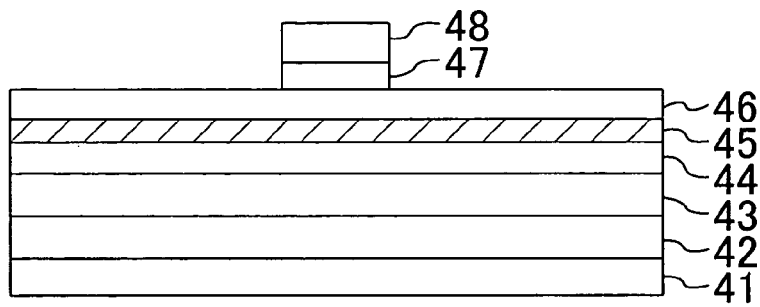

Next, as shown in FIG. 8B, a part of the p-AlGaN cladding layer 48 and the p-GaN guiding layer 47 is etched. In the case where it is difficult to completely remove the p-GaN guiding layer 47 without etching the p-$Al_{0.15}Ga_{0.85}N$ overflow suppressing layer 46 disposed below the p-GaN guiding layer 47, the p-GaN guiding layer 47 may partly remain.

Figure 8C:
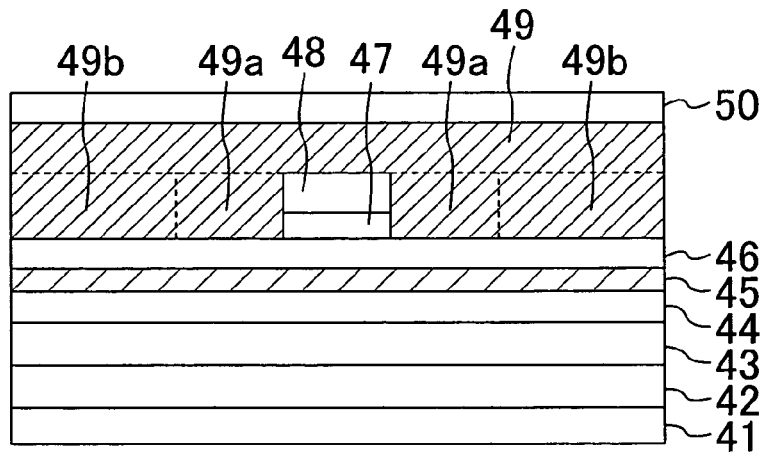

Then, as shown in FIG. 8C, at a second stage of the growth, an AlGaN layer (regrown layer) 49 and a p-GaN contact layer 50 are formed, while doping with Mg, on the p-$Al_{0.15}Ga_{0.85}N$ overflow suppressing layer 46 and the p-AlGaN cladding layer 48.

At this point, the growth is performed under conditions for accelerating the lateral growth, and hence, an n-type conductivity changed portion 49a having the n-type conductivity is formed on the side faces of the p-GaN guiding layer 47 and the p-AlGaN cladding layer 48. The width of the n-type conductivity changed portion 49a is varied depending upon the growth conditions and is generally approximately several μm. It is noted that a portion 49b of the AlGaN layer 49 excluding the n-type conductivity changed portion 49a has the p-type conductivity.

Figure 8D:
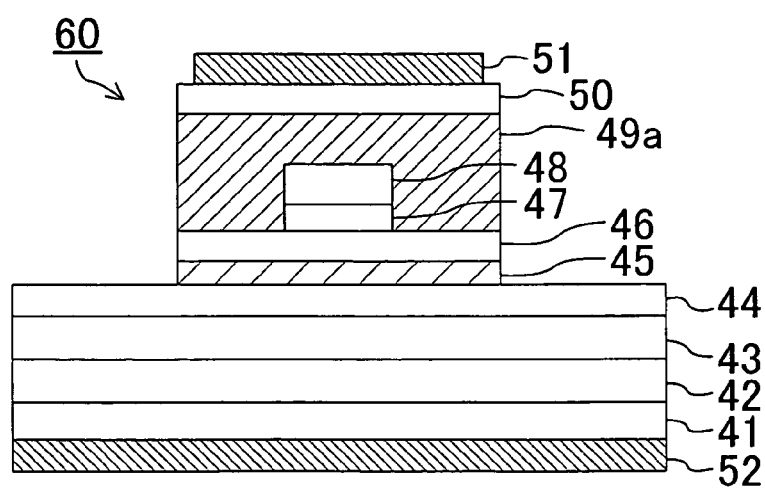
Figure 9:
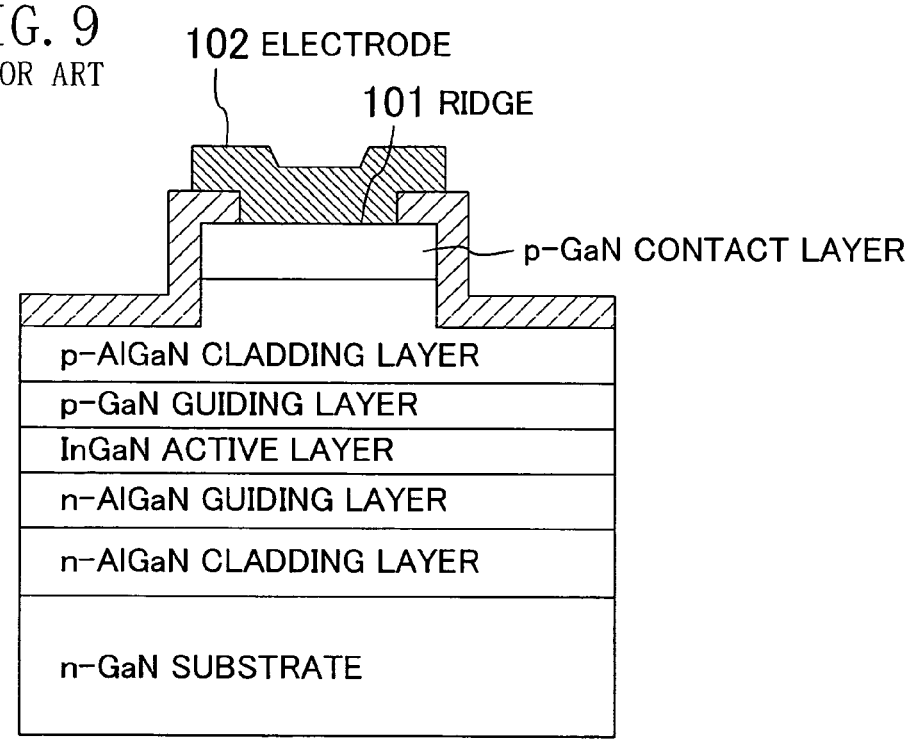
FIG. 9 is a cross-sectional view for showing the architecture of a conventional nitride semiconductor laser device having a ridge structure.
Figure 10:
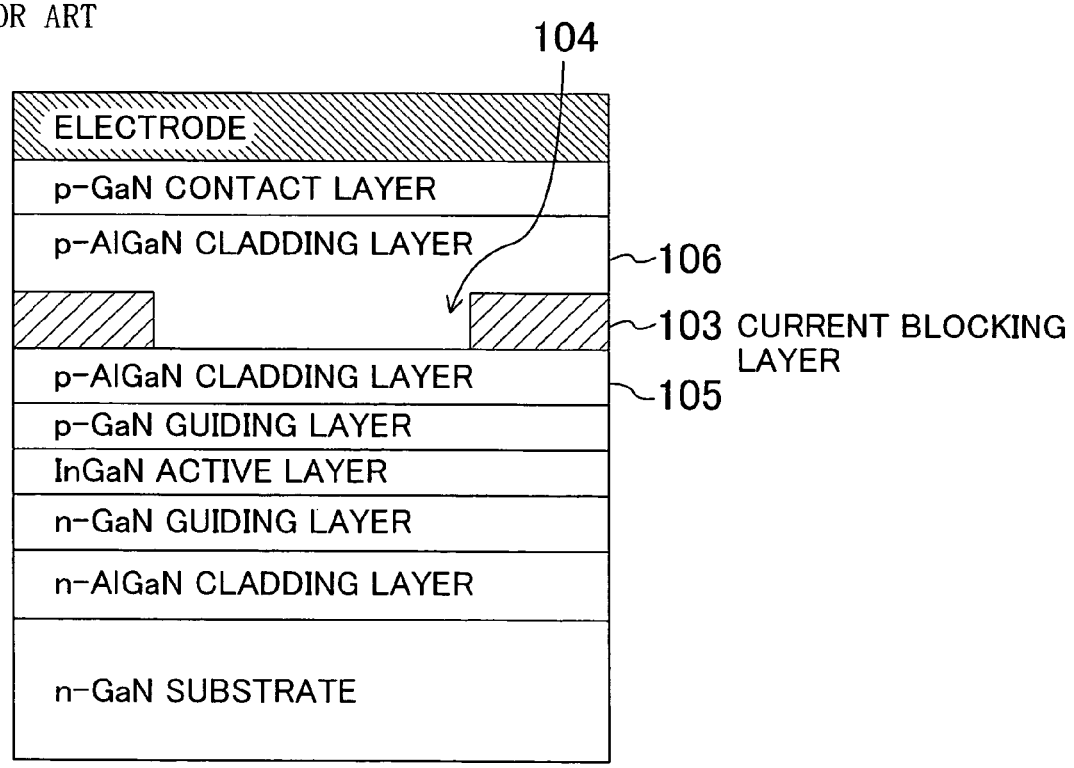
FIG. 10 is a cross-sectional view for showing the architecture of a conventional nitride semiconductor laser device having a buried type structure.

Ultimately, as shown in FIG. 8D, the portion 49b of the AlGaN layer 49 is removed by dry etching with the n-type conductivity changed portion 49a disposed above the p-$Al_{0.15}Ga_{0.85}N$ overflow suppressing layer 46 allowed to remain, and then, a p-type electrode 51 is formed on the p-GaN contact layer 50. Thereafter, the thickness of the 2-inch GaN substrate 41 is reduced by the polishing and an n-type electrode 52 is formed on the polished face. Thus, a nitride semiconductor laser device 60 is obtained.

In the nitride semiconductor laser device 60 shown in FIG. 8D, the n-type conductivity changed portion 49a functions as a current blocking layer. A current flows from the p-type electrode 51 through the p-GaN contact layer 50, the p-AlGaN cladding layer 48 and the p-GaN guiding layer 47, and light of a wavelength of 405 nm is emitted from the MQW active layer 45. Light confinement in a direction parallel to the active layer 45 is performed by utilizing a difference in the refractive index between the n-type conductivity changed portion (AlGaN layer) 49a and the p-GaN guiding layer 47 and the p-AlGaN cladding layer 48.

In the nitride semiconductor laser device 60 having this architecture, the current guiding portion and the portion where light is mainly distributed are not subjected to etching, and therefore, characteristic degradation otherwise caused through etching damage can be suppressed.

Although the present invention has been described in preferred embodiments, the embodiments are not restrictive but can be variously modified. For example, the width of the n-type conductivity changed portion (on one side) is preferably 0.25 μm or more for causing the self oscillation in the above-described embodiment. However, the object of the invention can be achieved even when the width of the n-type conductivity changed portion (on one side) is set to be less than 0.25 μm as far as the current blocking effect is exhibited in the case where the opening width (stripe width) of the current blocking layer is initially small.

Furthermore, in the above description, the phenomenon that a part of the p-type regrown layer is changed to have the n-type conductivity is expressed as "the change to the n-type conductivity". The concept of "the change to the n-type conductivity" of this invention includes a case where an effect similar to that of "the change to the n-type conductivity" is exhibited when a part of a p-type regrown layer is changed to have high resistance and exhibits a substantial current blocking function.

What is claimed is:

1. A self-pulsation nitride semiconductor laser device comprising:
    an active layer sandwiched between cladding layers; and
    a current blocking layer having an opening for confining a current flowing to said active layer, wherein a regrown layer made of a nitride semiconductor doped with a p-type impurity is formed on said current blocking layer for covering said opening of said current blocking layer, a portion of said regrown layer buried in said opening of said current blocking layer has an n-type conductivity, said portion is disposed to be adjacent to a side face of said opening, and said portion has a given width, one side of said given width that is located near the active layer is longer than the opposite side of said given width, and an Al composition ratio in said portion is smaller than an Al composition ratio in said current blocking layer.

2. The self-pulsation nitride semiconductor laser device of claim 1, wherein said given width is 0.25 μm or more.

3. The self-pulsation nitride semiconductor laser device of claim 1, wherein said current blocking layer is made of a nitride semiconductor layer doped with an n-type impurity.

4. The self-pulsation nitride semiconductor laser device of claim 1, wherein said current blocking layer has a smaller refractive index than said regrown layer.

5. The self-pulsation nitride semiconductor laser device of claim 1, wherein said regrown layer corresponds to a part of said cladding layers.

6. The self-pulsation nitride semiconductor laser device of claim 1, wherein said current blocking layer is AlGaN.

7. The self-pulsation nitride semiconductor laser device of claim 1, wherein said portion is GaN.

* * * * *